US008610061B2

(12) United States Patent
Matsumoto

(10) Patent No.: US 8,610,061 B2
(45) Date of Patent: Dec. 17, 2013

(54) SCANNING ELECTRON MICROSCOPE

(75) Inventor: Kenji Matsumoto, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 221 days.

(21) Appl. No.: 13/313,606

(22) Filed: Dec. 7, 2011

(65) Prior Publication Data

US 2012/0145899 A1 Jun. 14, 2012

(30) Foreign Application Priority Data

Dec. 9, 2010 (JP) ................................ 2010-274626

(51) Int. Cl.
H01J 37/28 (2006.01)
H01J 37/18 (2006.01)

(52) U.S. Cl.
USPC ....... 250/311; 250/310; 250/309; 250/441.11

(58) Field of Classification Search
USPC ...... 250/306, 307, 309–311, 396 ML, 396 R, 250/397–399, 440.11, 551.11, 442.11, 250/492.3
See application file for complete search history.

(56) References Cited

U.S. PATENT DOCUMENTS

| 4,072,844 | A | 2/1978 | Sayegh | |
|---|---|---|---|---|
| 6,057,553 | A | 5/2000 | Khursheed et al. | |
| 7,064,325 | B2 | 6/2006 | Buijsse et al. | |
| 7,067,820 | B2 | 6/2006 | Buijsse | |
| 7,880,144 | B2 * | 2/2011 | Kuwabata et al. | 250/311 |
| 2002/0084426 | A1 * | 7/2002 | Gerlach et al. | 250/492.1 |
| 2002/0117967 | A1 * | 8/2002 | Gerlach et al. | 315/13.1 |
| 2009/0173882 | A1 * | 7/2009 | Kuwabata et al. | 250/307 |
| 2013/0107186 | A1 * | 5/2013 | Ando et al. | 349/153 |

FOREIGN PATENT DOCUMENTS

| DE | 3842757 A1 | 6/1989 |
|---|---|---|
| DE | 11 2008 002 044 T5 | 12/2010 |
| JP | 56-032656 A | 4/1981 |
| JP | 6-215716 A | 8/1994 |
| JP | 7-142022 A | 6/1995 |
| JP | 2002-203507 A | 7/2002 |
| JP | 2004-31207 A | 1/2004 |
| JP | 2007-311117 A | 11/2007 |
| JP | 4349964 A | 10/2009 |

OTHER PUBLICATIONS

Japanese Office Action dated Jan. 29, 2013, issued in corresponding Japanese Patent Application No. 2010-274626, w/ English translation.
German Office Action dated Feb. 13, 2013, issued in corresponding German Patent Application No. 10 2011 087 955.2, w/ English translation.

* cited by examiner

Primary Examiner — Bernard E Souw
(74) Attorney, Agent, or Firm — Westerman, Hattori, Daniels & Adrian, LLP

(57) ABSTRACT

A seal member to be contacted with an observation object is provided at an open end of a lens barrel so that the observation object can be attracted to the lens barrel via the seal member and fixed in direct and close contact with the lens barrel when a vacuum is created in the lens barrel by a vacuum pump. In other words, instead of providing a sample chamber, the observation object is fixed in close contact with the lens barrel to prevent relative movement therebetween by a suction force even without a sample chamber. In this configuration, the interior of the lens barrel can be maintained in a vacuum state despite the absence of a sample chamber and no adverse effect occurs during observation because the lens barrel and the observation object are not moved relative to each other by vibration.

8 Claims, 4 Drawing Sheets

SCANNING ELECTRON MICROSCOPE

BACKGROUND

The present invention relates to a scanning electron microscope which allows observation of a sample by scanning the sample in synchronization with emission of electron rays. In particular, the present invention relates to a scanning electron microscope with which an observation object which is conventionally too large to fit in a sample chamber and therefore needs preliminary processing can be directly observed without any preliminary processing.

A scanning electron microscope (SEM) is conventionally known which enables the user to observe the composition or surface unevenness of a sample by converging electron rays emitted from an electron gun in a stepwise fashion with at least one electron lens to form a finely-focused flux of electrons, directing the formed convergent electron rays (electron beams) onto a sample as an observation object to scan the sample, and detecting secondary electrons and reflected electrons emitted from the sample in response to the scanning. One example of such a conventional scanning electron microscope is disclosed in JP-B-4349964.

FIG. 6 shows a configuration example of a conventionally known scanning electron microscope. The scanning electron microscope shown in FIG. 6 includes an electron gun 2 for emitting electron rays Z, scanning deflection means for converging the electron rays Z emitted from the electron gun 2 and deflecting the converged electron rays Z (electron beam) (in this example, a condenser lens 3, a scanning coil 5 and an objective lens 6 arranged in a multi-stage configuration correspond to the scanning deflection means), a secondary electron detector S1 for detecting secondary electrons emitted from a sample X as an observation object in response to the irradiation of the electron rays Z, the secondary electron detector S1 including a scintillator 8, a light guide F and a photomultiplier M, a reflected electron detector S2 for detecting reflected electrons emitted from the sample X as an observation object in response to the irradiation of the electron rays Z, a lens barrel 1 as a microscope main unit containing the electron gun 2, the scanning deflection means (3, 5, 6), the reflected electron detector S2 and the scintillator 8 with the photomultiplier M in an elongated shape protruded from a side thereof and connected to the scintillator 8 via the light guide F, a sample chamber 300 for containing the sample X as an observation object, a vacuum pump (not shown) for maintaining the interior of the lens barrel 1 and the sample chamber 300 in a vacuum state, and various control devices (not shown) for controlling respective parts of the scanning electron microscope.

The operation of the scanning electron microscope shown in FIG. 6 is described. First, the user opens a door K provided on a side of the sample chamber 300 and places a sample X as an observation object in the sample chamber 300. Then, the user closes the door K to close the sample chamber 300 in an airtight manner. The vacuum pump is activated to maintain the interior of the lens barrel 1 and the sample chamber 300 in a vacuum state. In other words, the air (atmosphere) in the sample chamber 300 and the lens barrel 1 is evacuated to create a vacuum in order to prevent the sample X in the sample chamber 300 from contacting the outside air prior to the emission of electron rays Z. In the lens barrel 1 maintained in a vacuum state as described above, the electron rays Z emitted from the electron gun 2 and accelerated as needed are converged and finely focused by at least one electron lens (electrostatic lens or electromagnetic lens using an electric field or magnetic field which can interfere with the electron rays, and the condenser lens 3, the objective lens 6 and so on correspond to the electron lens) and deflected by the scanning coil 5. Then, the electron rays Z are directed onto the sample X in the sample chamber 300 maintained in a vacuum state to scan a sample surface.

In response to the irradiation of the electron rays Z onto the sample X for scanning, secondary electrons and reflected electrons are emitted from the sample X. The secondary electrons and reflected electrons emitted from the sample X are detected by the detectors S1 and S2, respectively. A compositional image (COMPO image) or topographic image (TOPO image) is displayed on a display such as CRT (not shown) based on detection signals corresponding to the secondary electrons and reflected electrons detected by the detectors S1 and S2, and the user can observe the sample X by viewing the image displayed on the display. However, because the deflection control of the electron rays Z by the scanning coil 5 can provide only a limited observation area, the sample X is placed on a table O (which is also referred to as "stage") movable vertically and horizontally, and tiltable and rotatable in the sample chamber 300 so that an observed part (observation surface) on the sample X can be significantly changed by controlling the drive of the table O.

In the automobile industry, a wide variety of materials and parts used in automobiles should be observed to identify a type of the paint applied to a vehicle body, analyze its components and investigate its secular changes or to investigate aging degradation of pulleys of a CVT (continuously variable transmission) that occurs during its continued use. For these purposes, a scanning electron microscope as described above is used. To use a conventional scanning electron microscope, however, as described above, a sample as an observation object should be placed in an airtight sample chamber because the interior of the sample chamber and the lens barrel must be maintained in a vacuum state during the emission of electron rays. Thus, an observation object which is too large to fit in the sample chamber (an automobile part such as a vehicle body or pulley) must be processed into a sample small enough to fit in the sample chamber by, for example, cutting the observation object. In other words, such an observation object cannot be observed unless the observation object is cut into a sample small enough to fit in the sample chamber.

However, once an observation object, such as an automobile part, is processed by, for example, cutting, the observation object unavoidably loses its function and cannot be used for its intended purpose any more. In other words, cutting a sample out of an observation object is destroying the observation object. For example, when a sample small enough to fit in the sample chamber is cut out of the bonnet of a vehicle as an observation object to observe the paint applied thereto, the bonnet has a hole and cannot be used for its intended purpose any more. Thus, the conventional scanning electron microscope is not suited for continued observation of changes over time of an observation object (automobile part as described above) which undergoes deterioration or wear as the vehicle is used. This is a problem stemming from the fact that the conventional scanning electron microscope allows observation of only a sample which is at least small enough to fit in the sample chamber and in which an observed part can be changed by driving the table.

One possible solution to the above problem is to eliminate the airtight sample chamber in the conventional scanning electron microscope (what is called an exposure electron microscope). In this case, the observation object does not have to be destroyed but the lens barrel as a main unit must be reduced in size and weight to construct an exposure electron microscope which allows observation of a large observation object, such as a vehicle body or pulley, by emission of electron rays without a sample chamber.

However, the conventional scanning electron microscope has a condenser lens or objective lens made up of a magnetic field coil in the lens barrel, and the condenser lens or objective lens cannot be reduced in size any more because of the structure of the magnetic field coil. It is, therefore, difficult to reduce the size and weight of the lens barrel itself. Another reason why reduction in weight of the lens barrel is difficult is that the lens barrel is required to have sufficient strength to support a photomultiplier having relatively large length and weight because the photomultiplier with an elongated shape is directly mounted on a side of the lens barrel. In addition, the necessity to create a vacuum in the lens barrel and on the sample surface which results from the elimination of the sample chamber and adverse effects during observation due to vibration of the lens barrel which is more likely to occur when the lens barrel is made light and small (for example, the compositional image or topographic image displayed on the display may be blurred and difficult to observe) may arise as new problems. Because of the above reasons, a light and small scanning electron microscope without a sample chamber which allows direct observation of an observation object too large to fit in a sample chamber, such as a vehicle body or pulley, has been neither provided nor suggested.

SUMMARY OF THE INVENTION

The present invention has been made in view of the above points, and it is, therefore, an object of the present invention to provide a light and small scanning electron microscope which allows direct observation of an observation object which is conventionally too large to fit in a sample chamber and needs preliminary processing without any preliminary processing.

In accordance with the present invention, an electron microscope having an electron gun (2) for emitting electron rays, a scanning deflection device (4) for converging and deflecting the electron rays (Z) emitted from the electron gun (2) and irradiating the electron rays (Z) onto an observation object (X), and at least one of a secondary electron detector (S1) for detecting secondary electrons emitted from the observation object (X) in response to irradiation of the electron rays (Z) and a reflected electron detector (S2) for detecting reflected electrons emitted from the observation object (X) in response to irradiation of the electron rays (z), further includes a lens barrel (1) having an open end (1a) on the side toward which the electron rays (Z) emitted from the electron gun (2) travels and containing at least the electron gun (2) and the scanning deflection device (3, 4), and a seal member (7) which is provided at the open end (1a) of the lens barrel (1) and is brought into contact with the observation object (X), wherein the lens barrel (1) is fixed in direct and close contact with the observation object (X) by creating a vacuum in the lens barrel (1) so that the observation object (X) can be attracted to the lens barrel (1) via the seal member.

According to the present invention, a seal member (7) which is brought into contact with the observation object (X) is provided at the open end (1a) of the lens barrel (1) so that the observation object (X) can be attracted to the lens barrel (1) via the seal member (7) and fixed in direct and close contact with the lens barrel (1) when a vacuum is created in the lens barrel (1) by the vacuum pump. In other words, the observation object (X) is directly attracted to the open end (1a) of the lens barrel (1) and fixed in contact with the lens barrel (1) as a microscope main unit to prevent relative movement therebetween instead of using an airtight sample chamber as in a conventional scanning electron microscope. In this configuration, despite the fact that the electron microscope has a small and light lens barrel without a sample chamber, a vacuum state can be easily maintained in the lens barrel (1) and on a surface of the observation object (X) and adverse effects during observation, such as image blurring, do not occur even if the lens barrel (1) or the observation object (X) itself is vibrated because the lens barrel (1) and the observation object (X) do not move relative to each other. Because the lens barrel (1) can be directly mounted on the observation object (X) onto which the electron rays (Z) are irradiated, an observation object (X) which is conventionally too large to fit in a sample chamber can be directly observed without any preliminary processing.

The reference numerals in brackets above are given to indicate the corresponding constituent elements of the embodiment described below for the purpose of reference.

According to the present invention, because the observation object can be attracted to the lens barrel via the seal member and fixed in direct and close contact with the lens barrel when a vacuum is created in the lens barrel by the vacuum pump, it is possible to obtain the advantage that an observation object which is conventionally too large to fit in a sample chamber can be directly observed without any preliminary processing.

DETAILED DESCRIPTION

Description is hereinafter made of an embodiment of the present invention in detail with reference to accompanying drawings.

Figure 1:
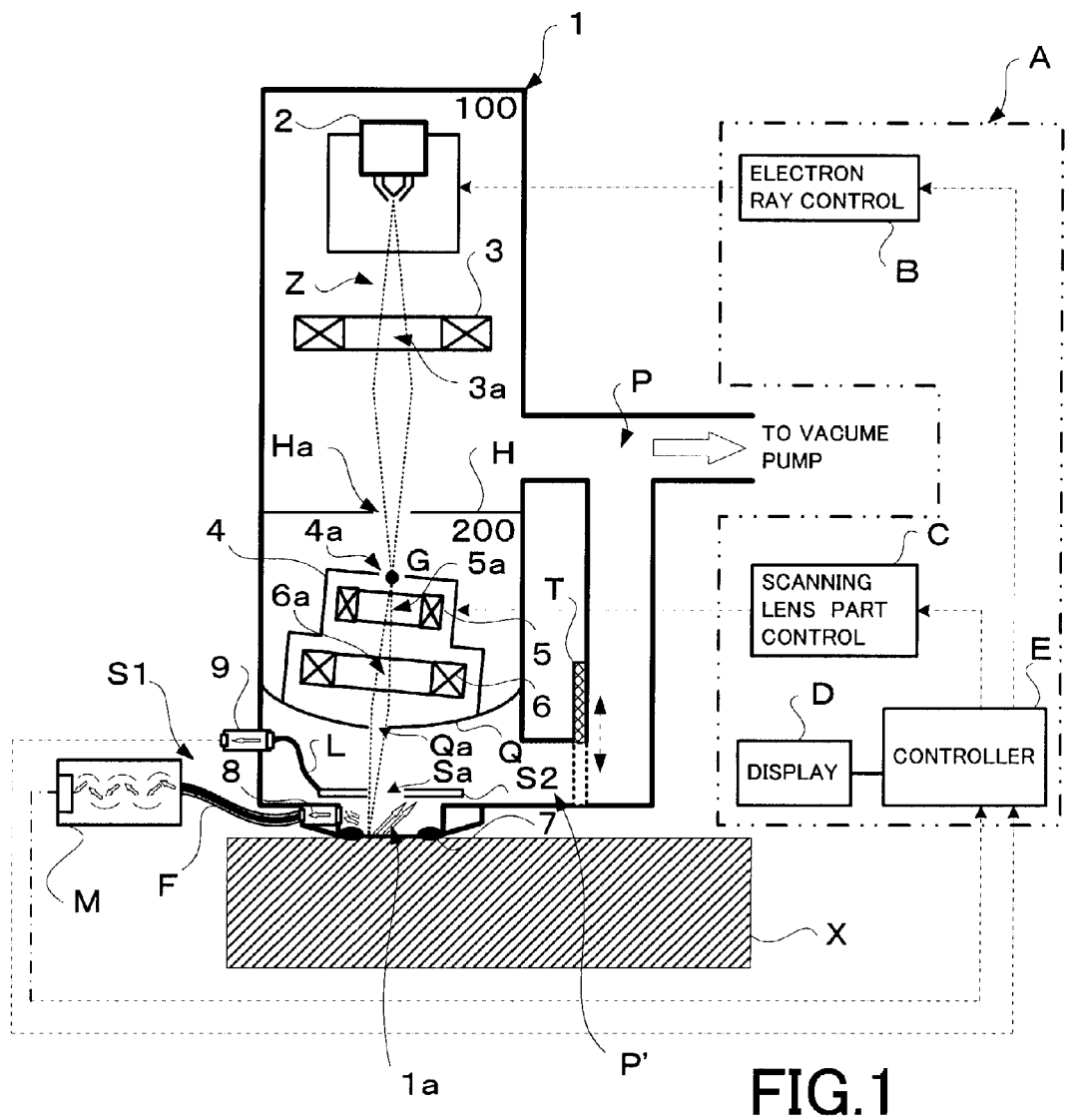
FIG. 1 is a conceptual diagram illustrating one embodiment of a general configuration of a scanning electron microscope according to the present invention.

FIG. 1 is a conceptual diagram illustrating one embodiment of a general configuration of a scanning electron microscope according to the present invention. The scanning electron microscope shown in FIG. 1 can be roughly divided into a lens barrel 1 constituting a microscope main unit for irradiating electron rays Z onto an observation object (sample) X, scanning the observation object X with the electron rays Z and so on, a secondary electron detector S1 and a reflected electron detector S2 provided separately and independently from the lens barrel 1 for detecting secondary electrons and reflected electrons, respectively, emitted from the observation object X in response to the irradiation of the electron rays Z, and a control device group A for performing electron ray control operations such as the emission of the electron rays Z and scanning in the lens barrel 1 and for displaying and presenting a compositional image (which is also referred to as "COMPO image") or topographic image (which is also referred to as "TOPO image") to the user based on detection signals (detection values, for example) corresponding to the detected secondary electrons and reflected electrons output from the detectors S1 and S2 in response to the electron ray control operations.

The lens barrel 1 as a microscope main unit has a circular cylindrical shape, for example, and contains an electron gun 2 for emitting the electron rays Z, a condenser lens 3 for converging the electron rays Z emitted from the electron gun 2 and accelerated to the radial center of the lens barrel 1, and a scanning lens part 4 for performing convergence and deflection control of the converged electron rays Z (electron beam) (in this embodiment, the condenser lens 3 and the scanning lens part 4 correspond to scanning deflection means). The condenser lens 3 is an electron lens and is constructed using permanent magnets instead of a magnetic field coil used in a conventional apparatus (refer to FIG. 2, which is described later). An objective lens 6 included in the scanning lens part 4 is also constructed using permanent magnets instead of a magnetic field coil as described later.

Figure 2:
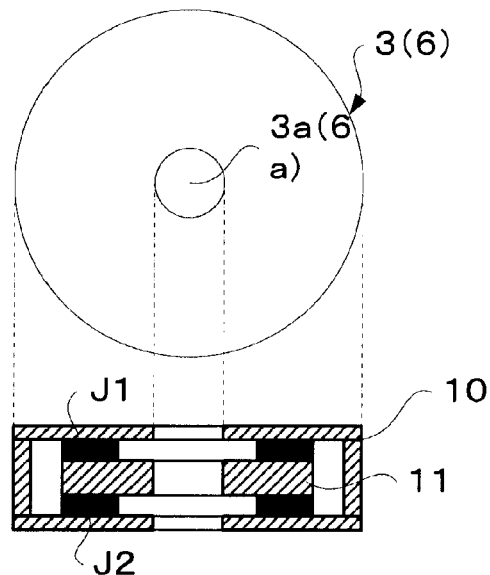
FIG. 2 is a cross-sectional view illustrating one embodiment of a condenser lens (or objective lens) constructed using permanent magnets.

Here, one example of the condenser lens 3 (or objective lens 6) constructed using permanent magnets is shown in FIG. 2. FIG. 2 is a cross-sectional view illustrating one embodiment of a condenser lens 3 (or objective lens 6) constructed using permanent magnets.

The condenser lens 3 (or objective lens 6, the same holds true in the following) shown in FIG. 2 has a circular cylindrical shape with a diameter approximately equal to the inside diameter of the lens barrel 1, and has a central hole 3a through which the electron rays Z pass. The central hole 3a has a diameter determined based on the magnetic flux density distribution depending on the distance from a point through which the central axis of the electron rays Z passes simulated based on a magnetic field analysis, and the electron rays Z within the range of the central hole 3a are converged but the electron rays Z outside the range of the central hole 3a are not converged. In other words, the amount of electron rays converged is proportional to the diameter of the central hole 3a. The condenser lens 3 has a sandwich structure in which two disk-shaped permanent magnets J1 and J2 each having a hole 3a at the center are interposed between a first core 10 with a U-shaped cross-section and a disk-shaped second core 11 each having a hole 3a at the center along the traveling direction of the electron rays Z, i.e., the longitudinal direction of the lens barrel 1.

Here, the reason why the permanent magnets J1 and J2 are used instead of a magnetic field coil is described. In general, when an elementary analysis or the like is carried out with a scanning electron microscope, the amount of X-ray radiation emitted from an observation object X in response to the irradiation of the electron rays Z should be equal to or greater than a predetermined level. Thus, a magnetic field coil (coil magnet) has been used to form a powerful magnetic field which can converge a larger amount of electron rays Z around the central hole 3a. However, an ordinary magnetic field coil, which is formed by winding a wire around a core a multiplicity of times, is difficult to reduce in size and is therefore not suited for reducing the size and weight of the lens barrel 1. In this embodiment, the permanent magnets J1 and J2, which are easier to reduce in size and weight than a magnetic field coil, are used to reduce the size and weight of the condenser lens 3 in order to reduce the size and weight of the lens barrel 1 itself.

However, the condenser lens 3 (or objective lens 6) using the permanent magnets J1 and J2 can converge less electron rays Z than a condenser lens using a magnetic field coil. Thus, even if the electron rays Z are irradiated onto an observation object X, an elementary analysis cannot be carried out because the amount of X-ray radiation does not reach a level necessary for elementary analysis. Therefore, the scanning electron microscope according to the present invention is limited in application to those which does not involve an elementary analysis, in other words, observation applications using secondary electrons and reflected electrons. Because the limitation of the application limits the role of the condenser lens 3 (and objective lens 6) to convergence of a minimum amount of electron rays Z necessary to obtain secondary electrons and reflected electrons necessary for observation, the condenser lens 3 (and objective lens 6) constructed using the permanent magnets J1 and J2 suffices.

Figure 3A:
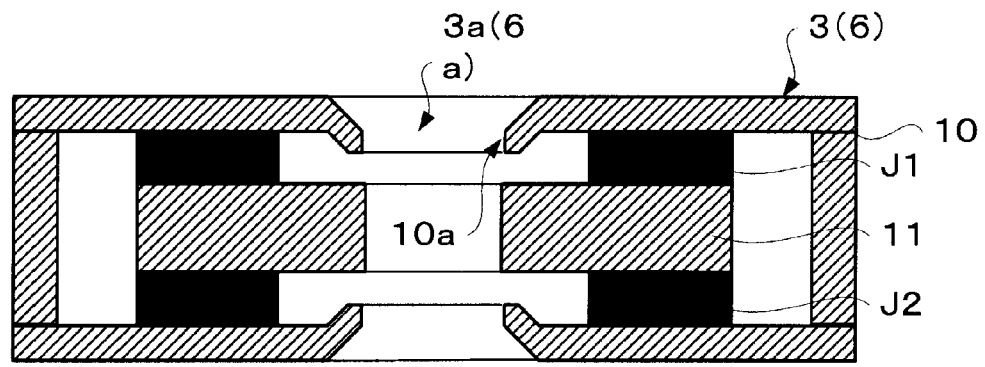
FIG. 3A and FIG. 3B are cross-sectional views illustrating other embodiments of the condenser lens (or objective lens) constructed using permanent magnets.
Figure 3B:
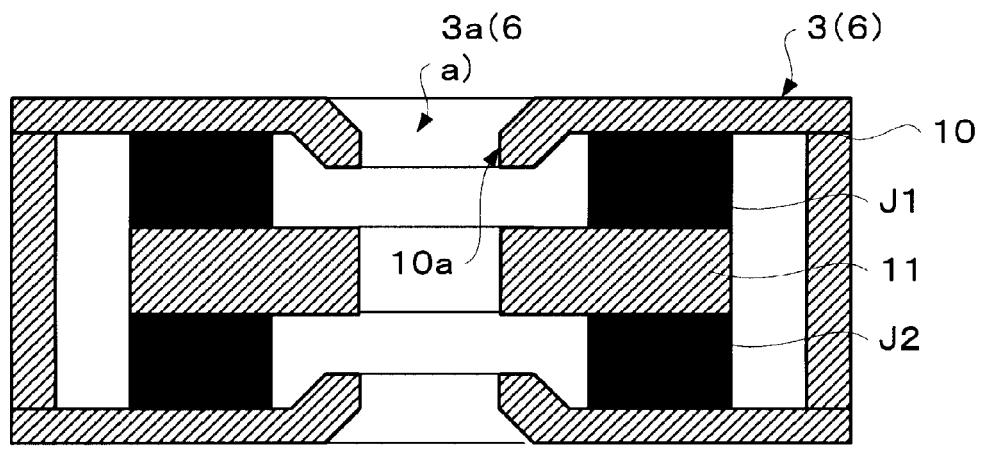

The condenser lens 3 using the permanent magnets J1 and J2 as described above cannot control the magnetic field electrically because of the characteristics of the permanent magnets J1 and J2 in contrast to a conventional condenser lens using a magnetic field coil. Thus, as for the condenser lens 3 (or objective lens 6) used in this embodiment, a plurality of condenser lenses 3 having different shapes of permanent magnets J1 and J2 or cores 10 and 11 are provided so that magnetic field can be controlled by changing the condenser lenses 3 when necessary. Examples of such a condenser lens 3 (or objective lens 6) are shown in FIG. 3A and FIG. 3B. FIG. 3A and FIG. 3B are cross-sectional views of other embodiments of the condenser lens 3 (or objective lens 6) constructed using permanent magnets.

The condenser lens 3 (or objective lens 6) shown in FIG. 3A is different in shape of the first core 10 with a U-shaped cross-section from the condenser lens 3 shown in FIG. 2. The first core 10 shown in FIG. 3A has core edges 10a facing the central hole 3a, the edges being bent toward the second core 11 located at the center in the cross-section. This makes the distance between the edges 10a of the first core 10 and the second core 11 smaller and the edges 10a of the first core 10 closer to the permanent magnets J1 and J2. On the other hand, the condenser lens 3 (or objective lens 6) shown in FIG. 3B is generally the same in configuration as the condenser lens 3 shown in FIG. 3A but has permanent magnets J1 and J2 with a larger thickness. When the distance (gap) between the permanent magnets J1 and J2 and the first core 10 is smaller than that in the condenser lens 3 shown in FIG. 2 or the permanent magnets J1 and J2 with a larger volume are used, a more powerful magnetic field can be formed around the central hole 3a (magnetic field control) and a larger amount of electron rays Z can be converged.

Referring again to FIG. 1, the electron rays Z converged by the condenser lens 3 (electron rays) is subjected to deflection control in its traveling direction by the scanning lens part 4. The scanning lens part 4, which performs deflection control of the electron rays Z after the convergence has a scanning coil 5 for deflecting the electron rays Z on the upstream side and an objective lens 6 for focusing the deflected electron rays Z on the downstream side. Naturally, the scanning lens part 4, and the scanning coil 5 and the objective lens 6 located in the scanning lens part 4 have holes 4a, 5a and 6a, respectively, through which the electron rays Z pass at their radial centers. As a movement mechanism for scrolling the viewing field of the scanning lens part 4 having the scanning coil 5 and the objective lens 6 integrated therewith, a spherical seat Q including a drive motor (not shown) for moving the scanning lens part 4 on a specific spherical surface body and the spherical surface body is provided. The spherical surface body of the spherical seat Q has a curvature such that its center coincides with the focal point of the condenser lens 3 (refer to point G in the drawing) and is located under the scanning lens part 4 with respect to the focal point G. This configuration allows the scanning lens part 4 to move on the spherical surface smoothly (in other words, the viewing field to be scrolled) in any radial direction of the lens barrel 1 with respect to the focal point G in response to actuation of the drive motor. Thus, even in this embodiment, in which the electron rays Z are irradiated onto an observation object X closely and fixedly attached to the lens barrel 1 as described later, the electron rays Z can be irradiated onto any part of a surface of the observation object X (although it is only a small area) without moving the observation object X.

In this embodiment, in order to solve the problem of a conventional mechanism for beam deflection, the fact that it is large in size and is not practical to reduce the size and weight of the lens barrel 1, but also the problem of conventional simple beam deflection using only a scanning coil, the fact that it increases the deflection aberrations during deflection and cannot provide high resolution, an electron optical system including the scanning lens part 4 having the scanning coil 5 and the objective lens 6 integrated therewith is adopted as a special electron optical system which can prevent aberrations due to beam deflection and the spherical seat Q is used as a mechanism for moving the scanning lens part 4. In other words, according to this configuration, because the normal direction of the principal surface of the objective lens 6 during beam deflection can be coincident with the incident direction of the electron rays Z by moving the scanning lens part 4 on the spherical seat Q, aberrations due to beam deflection which occur when the viewing field is moved can be minimum. In addition, because the optical axes of the electron gun 2 and the condenser lens 3 can be offset from the optical axis of the scanning lens part 4, by which the electron rays Z are finally irradiated onto the observation object X, an adverse effect during observation which may be caused, for example, by the fact that the brightness of a thermionic cathode reaches the observation object X when the electron gun 2 is a thermionic emission electron gun can be avoided.

The lens barrel 1 has a discharge passage P, and the discharge passage P is connected to a vacuum pump (not shown) via, for example, a flexible tube (such as a rubber tube). Thus, the air in the lens barrel 1 is evacuated through the discharge passage P and the interior of the lens barrel 1 is maintained in a vacuum state upon activation of the vacuum pump.

As can be understood from FIG. 1, in the lens barrel 1 of this embodiment, neither a sample chamber nor a table is provided at an end 1*a* as the destination of the electron rays Z emitted from the electron gun 2 in the first place. The end 1*a* of the lens barrel 1 is merely an opening. However, an annular seal member 7 shaped in conformity with the shape of the end is provided at the open end 1*a* of the lens barrel 1. The seal member 7 is made of an elastic material (such as rubber), and has a function of ensuring close contact between the lens barrel 1 and the observation object X to prevent air communication between the interior and exterior of the lens barrel 1. When a vacuum is created in the lens barrel 1 by actuating the vacuum pump as described above after the lens barrel 1 and the observation object X are brought into close contact with each other via the seal member 7, the observation object X is attracted to and held in close contact with the lens barrel 1 by the effect of the vacuum. Thus, the lens barrel 1 and the observation object X are not separated from each other unless the vacuum in the lens barrel 1 is broken.

However, even if the interior of the lens barrel 1 is attempted to be in a vacuum state to attract the observation object X, the degree of contact between the lens barrel 1 and the observation object X via the seal member 7 may be too low to ensure close contact between the lens barrel 1 and the observation object X depending on the type of unevenness on the surface of the observation object X. Thus, a plurality of seal members 7 with different shapes for different types of unevenness on the surface of the observation object X are preliminarily provided so that the seal members 7 can be changed as needed depending on the type of unevenness on the surface of the observation object X. FIG. 4 is a cross-sectional view illustrating embodiments of a seal member prepared for different types of unevenness on an observation object surface.

Figure 4A:
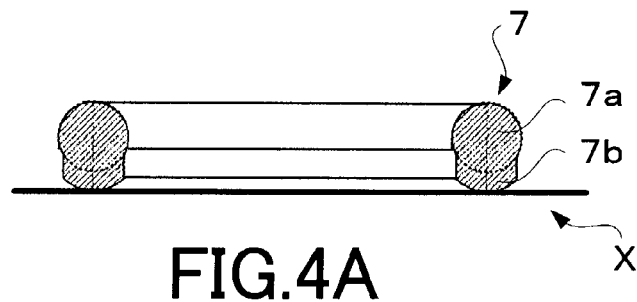
FIG. 4A to FIG. 4C are cross-sectional views illustrating embodiments of a seal member prepared for different types of unevenness on an observation object surface.

The seal member 7 shown in FIG. 4A is used to fix an observation object X with a relatively smooth surface. The seal member 7 has a circular cross-sectional portion 7*a* and an arcuate portion 7*b* protruded from the circular cross-sectional portion on the side to be contacted with the observation object X (i.e., observation surface side). With the increase in the degree of vacuum in the lens barrel 1, the protruded arcuate portion 7*b* is pressed to be deformed. Then, the observation object X is attracted to the lens barrel 1 with the contact surfaces of the arcuate portion 7*b* and the observation object X increased in area, and the interior of the lens barrel 1 is maintained in a high vacuum state without air communication between the interior and exterior of the lens barrel 1 because no gap is formed between the arcuate portion 7*b* and a surface of the observation object X. As a result, the lens barrel 1 and the observation object X are securely fixed in close contact with each other.

Figure 4B:
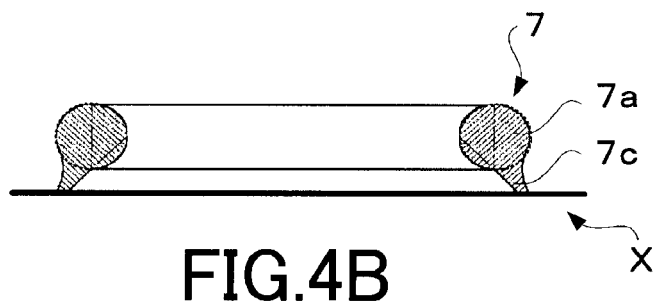

The seal member 7 shown in FIG. 4B is used to fix an observation object X with a slightly uneven and rough surface. The seal member 7 has a circular cross-sectional portion and a retaining plate portion 7*c* protruded from the circular cross-sectional portion toward the outer periphery of the lens barrel 1 and tapered toward its distal end on the side to be contacted with the observation object X (i.e., observation surface side). With the increase in the degree of vacuum in the lens barrel 1, the retaining plate portion 7*c* is pressed to be deformed against the observation object X and extended radially further outward. Then, the observation object X is attracted to the lens barrel 1 with the contact surfaces of the retaining plate portion 7*c* and the observation object X increased in area, and the interior of the lens barrel 1 is maintained in a high vacuum state without air communication between the interior and exterior of the lens barrel 1 because no gap is formed between the retaining plate portion 7*c* and a surface of the observation object X. As a result, the lens barrel 1 and the observation object X are securely fixed in close contact with each other even if the observation object X has a slightly uneven and rough surface.

Figure 4C:
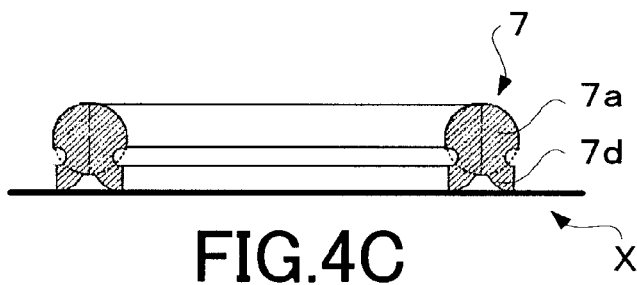

The seal member shown in FIG. 4C is used to fix an observation object X with a significantly uneven and rough surface. The seal member 7 has a circular cross-sectional portion and a retaining plate portion 7*d* protruded from the circular cross-sectional portion and having bifurcated portions respectively protruded toward the inner and outer peripheries of the lens barrel 1 on the side to be contacted with the observation object X (i.e., observation surface side). With the increase in the degree of vacuum in the lens barrel 1, the retaining plate portion 7*d* is pressed to be deformed against the observation object X and the bifurcated portions are extended radially inward and outward. Then, the observation object X is attracted to the lens barrel 1 and the bifurcated retaining plate portion 7*d* is brought into close contact with the uneven surface of the observation object X with their contact surfaces increased in area, and the interior of the lens barrel 1 is maintained in a vacuum state without air communication between the interior and exterior of the lens barrel 1 because no gap is formed between the retaining plate portion 7*d* and the surface of the observation object X. As a result, the lens barrel 1 and the observation object X are securely fixed in close contact with each other even if the observation object X has a significantly uneven and rough surface.

It should be noted that each of the seal members 7 described above is not limited for use in fixing an observation object X with a surface as described above. For example, the seal member 7 shown in FIG. 4C may be used to fix an observation object X with a relatively smooth surface or to fix an observation object X with a slightly uneven and rough surface.

When the electron rays Z are irradiated onto a surface of the observation object X, secondary electrons and reflected electrons are emitted from the observation object X fixed in close contact with (specifically, attracted to) the lens barrel 1 via the seal member 7. The secondary electrons and reflected electrons emitted from the observation object X are detected by the secondary electron detector S1 and the reflected electron detector S2, respectively.

The secondary electron detector S1 includes a scintillator 8, a light guide F, and a photomultiplier M. The scintillator 8 is located in the lens barrel 1, while the photomultiplier M, which has an elongated shape and is connected to the scintillator 8 via the light guide F, is not mounted on a side of the lens barrel 1 but located outside the lens barrel 1 separately and independently from the lens barrel 1. In this embodiment, a flexible optical fiber cable (optical signal transmission path) is used as the light guide F for connecting the scintillator 8 located in the lens barrel 1 and the photomultiplier M located separately outside the lens barrel 1. Because a flexible optical fiber cable is used, the photomultiplier M can be placed at any location outside the lens barrel 1 without significantly limiting the movement of the lens barrel 1 relative to the observation object X.

Figure 6:
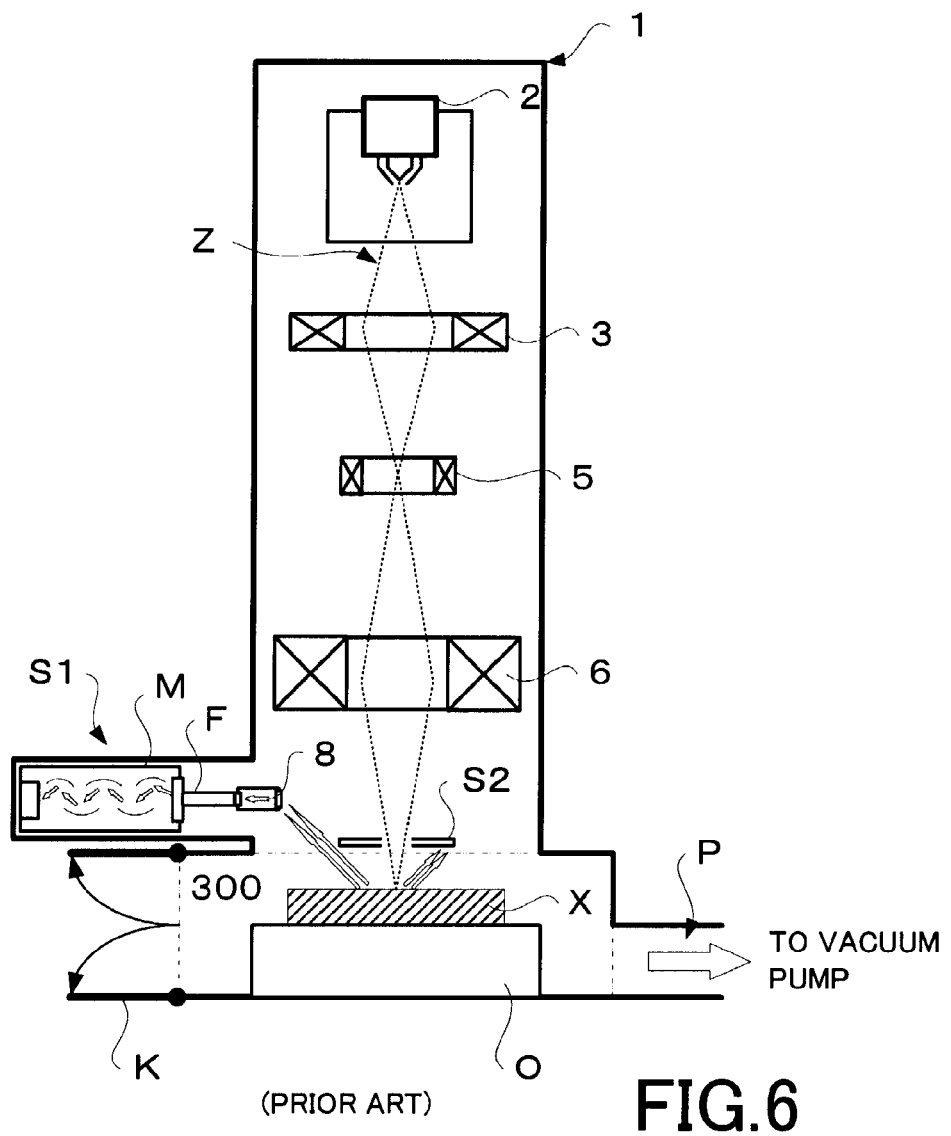
FIG. 6 is a conceptual diagram illustrating a configuration example of a conventionally-known scanning electron microscope.

The secondary electrons acquired (received) by the scintillator 8 are transmitted to the photomultiplier M through the optical fiber cable. The photomultiplier M converts the transmitted secondary electrons to an electrical detection signal, and outputs the detection signal to a controller part E (refer to FIG. 1), which is described later, electrically connected to the photomultiplier M. In this embodiment, the photomultiplier M with an elongated shape is not directly mounted on the lens barrel 1 but is located separately outside the lens barrel 1 and connected to the scintillator 8 located in the lens barrel 1 via the light guide F made up of a flexible optical fiber cable as described above. Thus, the lens barrel 1 can be reduced in size because the lens barrel 1 does not have to be shaped to have a portion significantly extending outward from a side thereof as in a conventional configuration (refer to FIG. 6), and the lens barrel 1 can be reduced in strength, in other words, the lens barrel 1 can be reduced in weight, because the lens barrel 1 does not have to support the photomultiplier M.

Figure 5:
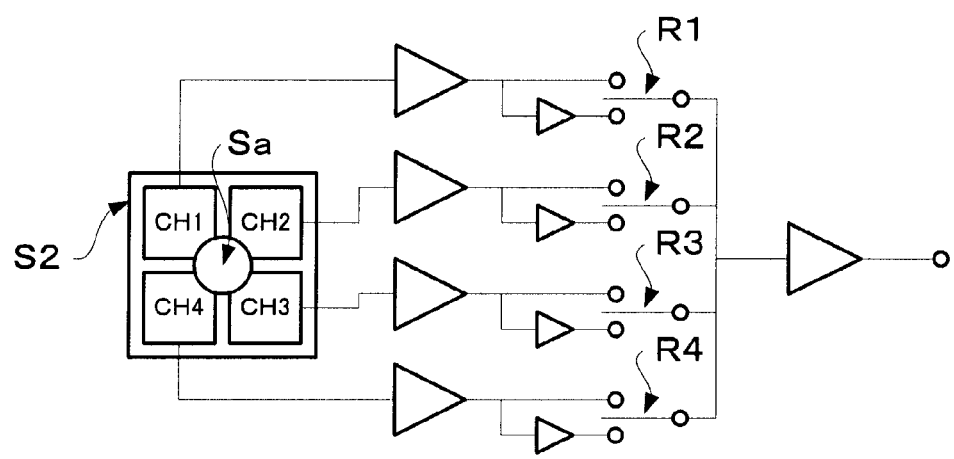
FIG. 5 is a conceptual diagram illustrating one embodiment of a reflected electron detector.

On the other hand, the reflected electron detector S2 is located to be immediately above the observation object X in the lens barrel 1, and has a hole Sa at its center through which the electron rays Z whose traveling direction already has received the deflection control by the scanning lens part 4 pass. Here, the reflected electron detector S2 is described with reference to FIG. 5. FIG. 5 is a conceptual diagram illustrating one embodiment of a reflected electron detector. The reflected electron detector S2 shown here is a detector made by quartering a detection area that detects the reflected electrons, and the polarities "+" and "−" of each of the quartered detection areas (channels CH1 to CH4) located around the hole Sa, through which the electron rays Z pass, can be freely set with polarity switching channels R1 to R4 provided for each of the detection areas as shown in the drawing. For example, a compositional image is displayed when the polarity switching channels R1 to R4 for all the four channels CH1 to CH4 are set to "+," and a topographic image is displayed when the polarity switching channels (R1 to R4) for two channels or one channel of the four channels CH1 to CH4 are set to "−" and the polarity switching channels (R1 to R4) for other channels are set to "+." In other words, the reflected electron detector S2 shown in FIG. 5 can display either a compositional image (COMPO image) or topographic image (TOPO image) according to the setting of the polarity switching channels 121 to R4. The reflected electron detector S2 generates an electrical detection signal corresponding to the detected reflected electrons and outputs the detection signal to the controller unit E (refer to FIG. 1), which is described later, electrically connected to the reflected electron detector S2 via a signal line L and a connector 9.

In a conventional configuration, a table O is moved to move the sample on the table O when the observation area (observation surface) on the sample is moved because the central axis of the electron rays Z is fixed in position. Then, the change in relative positions of the sample and the central axis of the electron rays Z which occurs as the table O is moved is identified based on the intensity distribution of the electron rays measured by a Faraday cup attached to the table O. In the present invention, however, deflection control of the electron rays Z is carried out by moving the scanning lens part 4 on the spherical seat Q because the table O is not provided, and a conventional Faraday cup for identifying the central axis of the electron rays Z is not provided. Thus, a mechanism is required, in place of a Faraday cup, to identify the exact position of the central axis of the electron rays Z which changes with movement of the scanning lens part 4.

In this embodiment, therefore, the quartered reflected electron detector S2 as described above is used to identify the position of the central axis of the electron rays Z converged by the condenser lens 3 and carry out necessary adjustment to place the center of the scanning lens part 4 on the central axis of the electron rays Z (in other words, optical axis adjustment; centering). In this case, it is determined that the center of the scanning lens part 4 has been correctly centered onto the central axis of the electron rays Z converged by the condenser lens 3 when the reflected electrons obtained in response to the irradiation of the electron rays Z are detected as being dispersed uniformly on the four quartered detection areas (channels CH1 to CH4).

Because the moving range is limited when scanning is carried out only with the electron rays Z moved by moving the scanning lens part 4 on the spherical seat Q, the obseravable range is limited as long as the observation object X is fixed. In a conventional configuration, the sample (observation object X) is placed on a table O (refer to FIG. 6) which is movable vertically and horizontally, and tiltable and rotatable in a sample chamber so that the observed part on the sample (observation object X) can be changed significantly by driving control of the table O as described above.

However, as can be understood from FIG. 1, the apparatus according to the present invention has neither a sample chamber nor a table on the open end side (lower end side in the drawing) of the lens barrel 1 in the first place. In the apparatus according to the present invention, because the electron rays Z are irradiated onto an observation object X fixed in contact with the open end of the lens barrel 1 by suction force, the apparatus itself has to be moved to an intended observation target on the observation object X. To do so, the lens barrel 1 has to be once separated from the observation object X. In the present invention, because the observation object X is merely attracted to the lens barrel 1 via the seal member 7 by means of a high vacuum state created in the lens barrel 1, the vacuum in the lens barrel 1 can be broken and the observation object X can be separated from the lens barrel 1 by, for example, tilting the lens barrel 1 itself to release the close contact between the lens barrel 1 and allow air to flow into the lens barrel 1, whereby the lens barrel 1 can be easily moved to any observation surface on the observation object X.

When the vacuum is broken to move the lens barrel 1 to an intended position on the observation object X, it is naturally necessary to create a high vacuum state in the lens barrel 1 again before another observation is made. For the purpose of reducing the time to create a vacuum state, a partition H for dividing the interior of the lens barrel 1 into two chambers 100 and 200 is provided in this embodiment. The partition H has a hole Ha at its center through which the electron rays Z pass. The discharge passage P connecting the lens barrel 1 and the vacuum pump (not shown) described above includes two discharge passages provided for each of the chambers 100 and 200 divided by the partition H. A shutoff gate T (shutter) is provided in the discharge passage P' connecting the chamber 200 on the side of the open end 1a of the lens barrel 1 (lower side in the drawing) of the two chambers 100 and 200 and the vacuum pump.

The shutoff gate T is controlled to keep the discharge passage P' open during emission of the electron rays Z when the lens barrel 1 and observation object X are not moved relative to each other (in other words, during observation) so that the chamber 200 (second chamber) on the side of the open end 1a, as well as the upper chamber 100 (first chamber), can be maintained in a high vacuum state by the vacuum pump. On the other hand, the shutoff gate T is controlled to keep the discharge passage P' closed when the electron rays Z are not emitted to move the lens barrel 1 relative to the observation object X (in other words, when no observation is made) to create a vacuum lower than that in the upper chamber 100 in the chamber 200 on the side of the open end 1a so that the lens barrel 1 can be easily separated from the observation object X. In addition, because the interior of the lens barrel 1 is divided into two chambers 100 and 200, when a high vacuum state is created again in the lens barrel 1 after the lens barrel 1 is moved to an intended position on the observation object 1, the time necessary to create the high vacuum state in the lens barrel 1 can be reduced because what should be done is to create a high vacuum state in the chamber 200 on the side of the open end 1a, in which the degree of vacuum has been reduced as compared to that in the upper chamber 100, as quickly as possible.

Referring again to FIG. 1, control commands are supplied to the electron gun 2 and the scanning deflection means (the condenser lens 3 and the scanning lens part 4 correspond to the scanning deflection means in this embodiment) provided in the lens barrel 1 from the controller unit E included in the control device group A to irradiate the electron rays Z onto the observation object X. The controller unit E is a computer including a CPU, a ROM, a RAM, and so on, for example, and sends control commands to an electron ray control unit B and a scanning lens part movement control unit C to control the irradiation of the electron rays Z onto a surface of the observation object X for the scanning with the electron rays Z in the lens barrel 1.

The electron rays control unit B controls the electron gun 2 in the lens barrel 1 to start and stop the emission of the electron rays Z according to a control command from the controller unit E. The scanning lens part movement control unit C controls an operation mechanism for moving the scanning lens part 4 on the spherical seat Q in the lens barrel to deflect the electron rays Z according to a control command from the controller unit E. The controller unit E receives signals corresponding to the secondary electrons and reflected electrons detected by the detectors S1 and S2, which are separately located outside the lens barrel 1, and displays a compositional image (COMPO image) or topographic image (TOPO image) on a display unit D based on the received signals. The user can observe the observation object X by viewing the image displayed on the display unit D.

Although not shown, the control device group A may include a power supply to energize the various components, a vacuum pump control unit for controlling the on/off of the vacuum pump, a gate control unit for controlling opening and closing of the shutoff gate T provided in the discharge passage P connecting the lens barrel 1 and the vacuum pump, and so on. It is needless to say that the control device group A may include other constituent elements such as control units other than those described above.

In this embodiment, the seal member 7, which is brought into direct contact with the observation object X, is provided at the open end 1a of the lens barrel 1 as described above. When a vacuum is created in the lens barrel 1 by the vacuum pump, the seal member 7 in contact with the observation object X is deformed to allow the observation object X to be attracted to the lens barrel 1. At this time, a vacuum state is maintained in the lens barrel 1 and on a surface of the observation object X. The attraction of the observation object X via the seal member 7 can fix the observation object X in direct and close contact with the lens barrel 1. In other words, the observation object X is directly attracted to the open end 1a of the lens barrel 1 and fixed in contact with the lens barrel 1 as a microscope main unit to prevent relative movement therebetween instead of using an airtight sample chamber as in a conventional scanning electron microscope.

In this configuration, despite the fact that the electron microscope has a small and light lens barrel without a sample chamber, a vacuum state can be easily maintained in the lens barrel 1 and on a surface of the observation object X and adverse effects during observation, such as image blurring, do not occur even if the lens barrel 1 or the observation object X itself is vibrated because the lens barrel 1 and the observation object X are not moved relative to each other. Because the lens barrel 1 can be directly mounted on the observation object X onto which the electron rays Z are irradiated, an observation object X which is conventionally too large to fit in a sample chamber can be directly observed without any preliminary processing.

Because the scintillator 8 of the secondary electron detector S1 is located in the lens barrel 1 while the photomultiplier M is located outside the lens barrel 1 separately and independently from the lens barrel 1, the lens barrel 1 can be reduced in size compared to the case where the photomultiplier M is directly provided in the lens barrel 1 and the lens barrel 1 can be reduced in weight because the lens barrel 1 itself does not require high strength. In addition, because the condenser lens 3 and the objective lens 6 are constructed using permanent magnets J1 and J2, the condenser lens and objective lens can be smaller than the condenser lens and objective lens constructed using a magnetic field coil, which leads to a reduction in size and weight of the lens barrel 1 itself. Moreover, because the traveling direction of the electron rays Z in the lens barrel 1 is controlled to move the viewing field by moving the scanning lens part 4 having the scanning coil 5 and the objective lens 6 integrally therewith on a specific spherical surface along the spherical seat Q, the observed part (observation surface) on the observation object X can be significantly changed despite the fact that the lens barrel 1 does not have a sample chamber.

In addition, the scanning electron microscope according to the present invention, which has a small and light lens barrel 1, can be easily mounted on an end of an arm or the like, and can be used to observe, for example, component parts on the entire automobile (completed vehicle), such as upper, lower and side surfaces of an automobile and those used in the engine or in a car interior, because the open end does not necessarily have to be oriented downward but may be oriented in any direction to make observation.

While one example of the embodiment has been described with reference to the drawings, it is needless to mention that the present invention is not limited thereto and various embodiments are possible. In addition, the application of the present invention is not limited to a scanning electron microscope. For example, the present invention is also applicable to an electron beam imaging device. Further, various modification can be made without departing from the gist of the present invention.

This application is based on, and claims priority to, JP PA 2010-274626 filed on 9 Dec. 2010. The disclosure of the priority applications, in its entirety, including the drawings, claims, and the specification thereof, are incorporated herein by reference.

What is claimed is:

1. An electron microscope having an electron gun for emitting electron rays, a scanning deflection device for converging and deflecting the electron rays emitted from the electron gun and irradiating the electron rays onto an observation object, and at least one of a secondary electron detector for detecting secondary electrons emitted from the observation object in response to irradiation of the electron rays and a reflected electron detector for detecting reflected electrons emitted from the observation object in response to irradiation of the electron rays, further comprising
   a lens barrel having an open end on the side toward which the electron rays emitted from the electron gun travels and containing at least the electron gun and the scanning deflection device; and
   a seal member which is provided at the open end edge of the lens barrel and is brought into contact with the observation object,
   wherein the lens barrel is fixed in direct and close contact with the observation object by creating a vacuum in the lens barrel so that the observation object can be attracted to the lens barrel via the seal member.

2. The electron microscope according to claim 1, wherein the secondary electron detector includes at least a cintillator, a light guide, and a photomultiplier, and the photomultiplier is located outside the lens barrel separately and independently from the lens barrel and the light guide for transmitting secondary electrons acquired by the scintillator located in the lens barrel to the photomultiplier is formed of an optical signal transmission path made of a flexible material.

3. The electron microscope according to claim 1, wherein the scanning deflection device includes a condenser lens for converging the electron rays and an objective lens for focusing the converged electron rays onto the observation object, and at least one of the condenser lens and the objective lens is constructed using a permanent magnet.

4. The electron microscope according to claim 3, wherein at least one of the condenser lens and the objective lens comprises a permanent magnet having a hole through which the electron rays emitted from the electron gun pass and a core surrounding the permanent magnet and having an edge facing the hole and bent toward the permanent magnet.

5. The electron microscope according to claim 1, wherein the scanning deflection device includes a scanning coil for deflecting the electron rays and a objective lens integrated with the scanning coil, and wherein the traveling direction of the electron rays in the lens barrel is controlled by moving the objective lens integrated with the scanning coil on a specific spherical surface along a spherical seat to move the viewing field.

6. The electron microscope according to claim 1, wherein the reflected electron detector is a detector made by quartering a detection area that detects the reflected electrons from the observation object in response to irradiation of the electron rays.

7. The electron microscope according to claim 1, further comprising a partition for dividing the interior of the lens barrel into two chambers, discharge passages connecting a vacuum pump and each of the two chambers, respectively, and a gate for opening and closing the discharge passage connecting the chamber on the side of the open end of the two chambers and the vacuum pump.

8. The electron microscope according to claim 1, further comprising a vacuum pump for creating a vacuum in the lens barrel.

* * * * *